United States Patent
Liu et al.

(10) Patent No.: US 9,331,032 B2
(45) Date of Patent: May 3, 2016

(54) HYBRID BONDING AND APPARATUS FOR PERFORMING THE SAME

(71) Applicant: Taiwan Semiconductor Manufacturing Company, Ltd., Hsin-Chu (TW)

(72) Inventors: Ping-Yin Liu, Yonghe (TW); Xin-Hua Huang, Xihu Township (TW); Chih-Hui Huang, Yongkang (TW); Lan-Lin Chao, Sindian (TW); Yeur-Luen Tu, Taichung (TW); Yan-Chih Lu, Tainan (TW); Jhy-Jyi Sze, Hsin-Chu (TW); Chia-Shiung Tsai, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/787,566

(22) Filed: Mar. 6, 2013

(65) Prior Publication Data
US 2014/0256087 A1    Sep. 11, 2014

(51) Int. Cl.
*H01L 23/00* (2006.01)

(52) U.S. Cl.
CPC ............ *H01L 24/03* (2013.01); *H01L 24/74* (2013.01); *H01L 24/80* (2013.01); *H01L 24/94* (2013.01); *H01L 24/08* (2013.01); *H01L 2224/08145* (2013.01); *H01L 2224/7501* (2013.01); *H01L 2224/753* (2013.01); *H01L 2224/757* (2013.01); *H01L 2224/7525* (2013.01); *H01L 2224/7598* (2013.01); *H01L 2224/75251* (2013.01); *H01L 2224/75252* (2013.01); *H01L 2224/80011* (2013.01); *H01L 2224/80013* (2013.01); *H01L 2224/80065* (2013.01); *H01L 2224/80075* (2013.01); *H01L 2224/80121* (2013.01); *H01L 2224/80204* (2013.01); *H01L 2224/80209* (2013.01); *H01L 2224/80895* (2013.01); *H01L 2224/80896* (2013.01); *H01L 2224/80907* (2013.01); *H01L 2224/80948* (2013.01); *H01L 2224/94* (2013.01); *H01L 2924/01322* (2013.01)

(58) Field of Classification Search
None
See application file for complete search history.

(56) References Cited

U.S. PATENT DOCUMENTS

| | | | |
|---|---|---|---|
| 4,573,627 A | 3/1986 | Miller et al. | |
| 8,104,666 B1* | 1/2012 | Hwang et al. | 228/180.22 |
| 2007/0296073 A1* | 12/2007 | Wu | H01L 21/6835 257/686 |
| 2008/0179740 A1* | 7/2008 | Liao | 257/738 |
| 2009/0291524 A1* | 11/2009 | Takahashi | 438/108 |
| 2010/0050423 A1* | 3/2010 | Yu et al. | 29/739 |
| 2010/0193884 A1* | 8/2010 | Park et al. | 257/414 |
| 2012/0162380 A1* | 6/2012 | Cho et al. | 348/47 |
| 2013/0270230 A1* | 10/2013 | Cheung et al. | 219/121.6 |
| 2013/0299986 A1* | 11/2013 | Sun et al. | 257/741 |

FOREIGN PATENT DOCUMENTS

| | | |
|---|---|---|
| TW | 292416 | 12/1996 |
| TW | 201110309 | 3/2011 |

* cited by examiner

*Primary Examiner* — Charles Garber
*Assistant Examiner* — Brigitte Paterson
(74) *Attorney, Agent, or Firm* — Slater & Matsil, L.L.P.

(57) ABSTRACT

A method includes performing a hybrid bonding to bond a first package component to a second package component, so that a bonded pair is formed. In the bonded pair, first metal pads in the first package component are bonded to second metal pads in the second package component, and a first surface dielectric layer at a surface of the first package component is bonded to a second surface dielectric layer at a surface of the second package component. After the hybrid bonding, a thermal compressive annealing is performed on the bonded pair.

20 Claims, 10 Drawing Sheets

HYBRID BONDING AND APPARATUS FOR PERFORMING THE SAME

BACKGROUND

In wafer-to-wafer bonding technology, various methods have been developed to bond two package components (such as wafers) together. The available bonding methods include fusion bonding, eutectic bonding, direct metal bonding, hybrid bonding, and the like. In the fusion bonding, an oxide surface of a wafer is bonded to an oxide surface or a silicon surface of another wafer. In the eutectic bonding, two eutectic materials are placed together, and are applied with a high pressure and a high temperature. The eutectic materials are hence melted. When the melted eutectic materials are solidified, the wafers are bonded together. In the direct metal-to-metal bonding, two metal pads are pressed against each other at an elevated temperature, and the inter-diffusion of the metal pads causes the bonding of the metal pads. In the hybrid bonding, the metal pads of two wafers are bonded to each other through direct metal-to-metal bonding, and an oxide surface of one of the two wafers is bonded to an oxide surface or a silicon surface of the other wafer.

The previously developed bonding methods have their advantageous features and disadvantageous features. For example, the fusion bonding requires low forces, and may be performed at room temperature. However, since there is no electrical connection between the bonded wafers, extra electrical connections need to be made to interconnect the bonded wafers. The Eutectic bonding does not require high-quality surfaces, and hence the pre-requirement for a successful bonding is loosened. The accuracy of the eutectic bonding, however, is low, and there may be metal-squeeze problem during the eutectic bonding due to the melting of the bonding metals. The direct metal-to-metal bonding has a high accuracy. The throughput, however, is very low. In the hybrid bonding, there may be dielectric delamination problem. The reason is that in the hybrid bonding, metal pads have higher Coefficient of Thermal Expansion (CTE) than the dielectric layers and silicon at the surfaces of the bonded wafers. The greater expansion of the metal pads causes the oxide of one wafer to be pushed away from the silicon or the oxide on the other wafer.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method for bonding package components and the apparatus for performing the bonding are provided in accordance with various exemplary embodiments. The intermediate stages of the bonding process are illustrated. The variations of the apparatus and bonding methods in accordance with embodiments are discussed. Throughout the various views and illustrative embodiments, like reference numbers are used to designate like elements.

Figure 11:
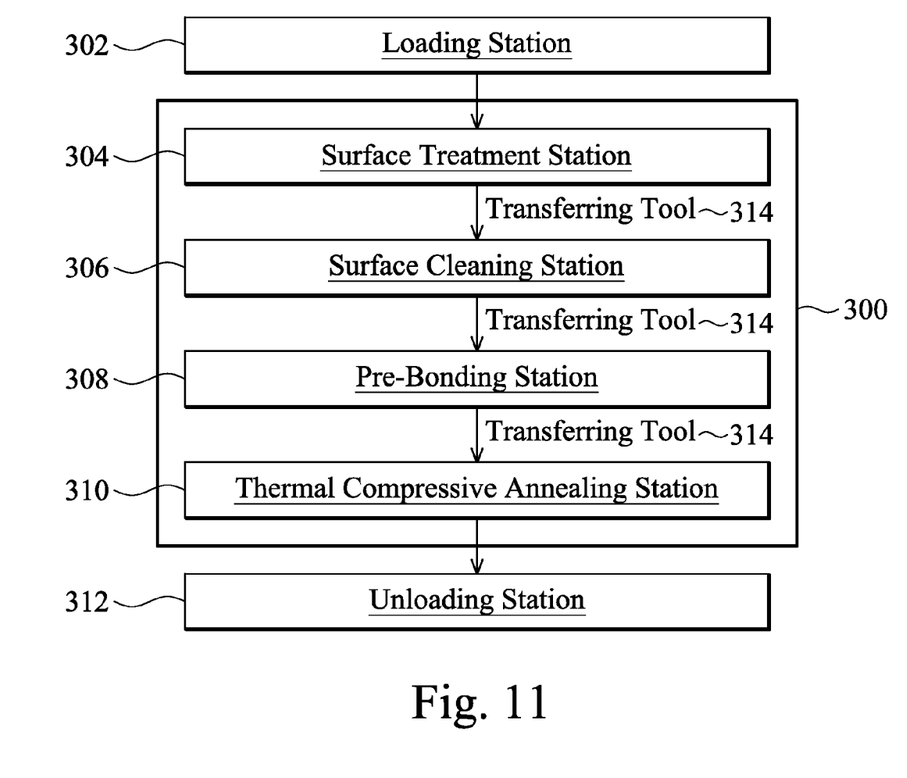
FIG. 11 illustrates a process flow for bonding package components and an apparatus for performing the bonding in accordance with exemplary embodiments.

FIGS. 1 through 6 illustrate cross-sectional views of intermediate stages in a bonding process in accordance with embodiments of the present disclosure. The process steps may be performed using apparatus 300 shown in FIG. 11. A brief process flow is briefly described herein, and the details of the process flow and apparatus 300 are discussed referring to the process steps shown in FIGS. 1 through 6. Referring to FIG. 11, the package components that are to be bonded (for example, package components 100 and 200 in FIGS. 1 and 2, respectively) are loaded into apparatus 300 through loading station 302. Loading station 302 may be a loadlock, for example. Next, surface treatments are performed on the surfaces of the package components, wherein the surface treatments are performed in surface treatment station 304. A surface cleaning is then performed on the package components to remove chemicals, particles, or other undesirable substances from the surfaces of the package components. Surface cleaning station 306 is configured to perform the surface cleaning in accordance with some embodiments.

A pre-bonding is then performed to bond the package components together. The respective bonding method may be hybrid bonding. The pre-bonding is performed in pre-bonding station 308. After the pre-bonding, the package components are bonded to each other. The bonding strength may then be enhanced through a thermal compressive annealing, which is held in thermal compressive annealing station 310. Transferring tools 314 are used to transfer the package components between stations 304, 306, 308, and 310. Transferring tools 314 may include loadlocks, robot arms, transferring guides, and/or the like, which are used for automatically transferring the package components from one station to another, so that the bonding process may be automated. After the bonding process is finished, the bonded package components are unloaded from apparatus 300 using unloading station 312, which may include robot arms, for example.

Figure 1:
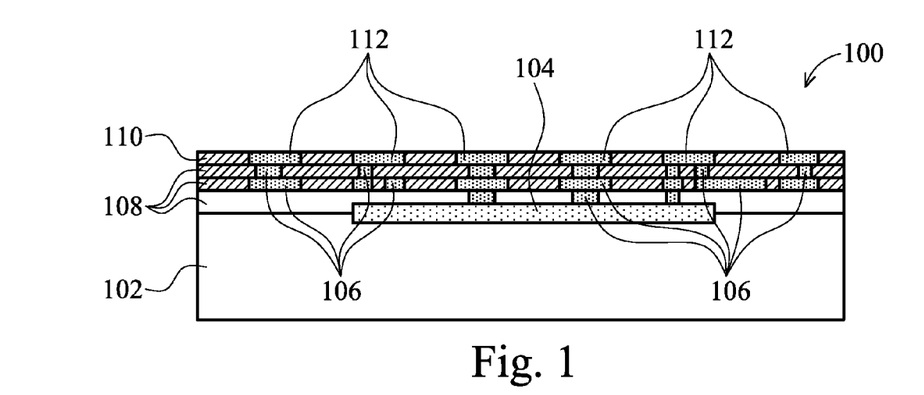
FIGS. 1 through 6 are cross-sectional views of intermediate stages in the bonding of two package components in accordance with some exemplary embodiments.

Referring to FIG. 1, package component 100 is illustrated. Package component 100 may comprise a device wafer, a packaged wafer, an interposer wafer, or the like. In the embodiments package component 100 comprise a device wafer, package component 100 may include semiconductor substrate 102, which may be, for example, a silicon substrate, although other semiconductor substrates are also usable. Active devices 104 may be formed on a surface of substrate 102, and may include, for example, transistors. Metal lines and vias 106 are formed in dielectric layers 108, which may be low-k dielectric layers in some embodiments. Dielectric layers 108 may also comprise non-low-k dielectric materials having dielectric constants (k values) greater than 3.9. Metal lines and vias 106 may comprise copper, aluminum, nickel, tungsten, or alloys thereof. Metal lines and vias 106 interconnect active devices 104, and may connect active devices 104 to the overlying metal pads 112.

In alternative embodiments, package component 100 is an interposer wafer, which is free from active devices therein. Package component 100 may, or may not, include passive devices (not shown) such as resistors, capacitors, inductors, transformers, and the like in accordance with some embodiments.

In yet alternative embodiments, package component 100 is a package substrate. In some embodiments, package component 100 is a laminate package substrate, wherein conductive traces 106 (which are schematically illustrated) are embedded in laminate dielectric layers 108. In alternative embodiments, package components 100 are built-up package substrates, which comprise cores (not shown), and conductive traces (represented by 106) built on opposite sides of the cores. The conductive traces 106 are interconnected through conductive features in the core.

In each of the embodiments wherein package component 100 is a device wafer, an interposer wafer, a package substrate, or the like, surface dielectric layer 110 is formed at the surface of package component 100. In some embodiments, surface dielectric layer 110 is an oxide layer, which may comprise silicon oxide, SiON, SiN, or the like. Metal pads 112 are formed in surface dielectric layer 110, and may be electrically coupled to active devices 104 through metal lines and vias 106. Metal pads 112 may also be formed of copper, aluminum, nickel, tungsten, or alloys thereof. The top surface of surface dielectric layer 110 and the top surfaces of metal pads 112 are substantially level with each other. In the embodiments wherein package component 100 is a device wafer, surface dielectric layer 110 and metal pads 112, which are used for the subsequent bonding, may be on the front side (the side with active devices 104) or the back side of substrate 102, although FIG. 1 illustrates that surface dielectric layer 110 and metal pads 112 are on the front side of substrate 102.

Figure 2:
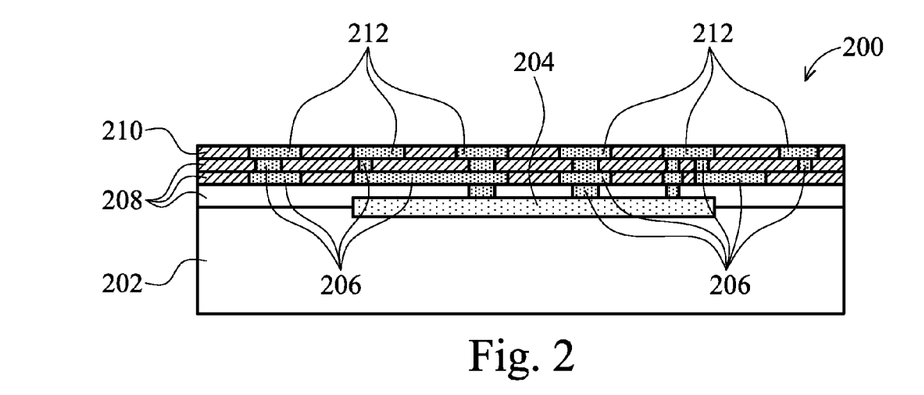

FIG. 2 illustrates package component 200, which is to be bonded to package component 100. Package component 200 may also be selected from a device wafer, an interposer wafer, a package substrate, and the like. In the illustrated FIG. 2, package component 200 includes substrate 202, active devices 204, dielectric layers 208, metal lines and vias 206 in dielectric layers 208, surface dielectric layer 210, and metal pads 212. Package component 200 may have a structure similar to what is described for package component 100, and the details are not repeated herein. The materials of the features in package component 200 may be found referring to the like features in package component 100, with the like features in package component 100 starting with number "1," which features correspond to the features in package component 200 and having reference numerals starting with number "2."

Figure 3:
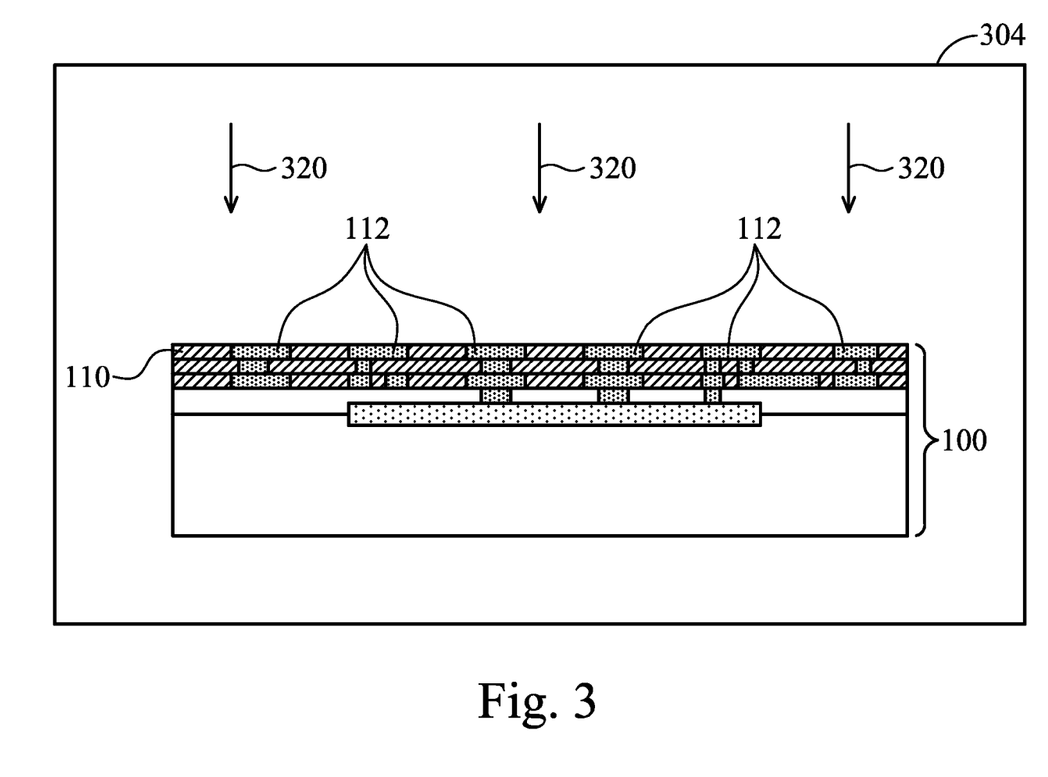

Next, referring to FIG. 3, package component 100 is loaded into surface treatment station 304, which is a part of apparatus 300 in FIG. 11. The loading may be performed using loading station 302 as described regarding FIG. 11. Referring to FIG. 3, a surface treatment (symbolized by arrows 320) is performed on the surface of package component 100. The surface treatment may include a plasma treatment and/or an acid treatment. When the acid treatment is performed, the surface of metal pads 112 and surface dielectric layer 110 are treated with an acid, which may include, for example, formic acid (HCOOH). Through the acid, the metal oxide on the surfaces of metal pads 112 may be removed. Some particles and undesirable substances on the surface of metal pads 112 and surface dielectric layer 110 are also removed.

The plasma treatment in the surface treatment station 304 may be performed in a vacuum environment (a vacuum chamber), for example, which is a part of the surface treatment station 304 (FIGS. 3 and 11). The process gas used for generating the plasma may include a first combined gas of hydrogen ($H_2$) and argon (Ar), a second combined gas of $H_2$ and nitrogen ($N_2$), or a third combined gas of $H_2$ and helium (He).

In some exemplary embodiments, the flow rate ratio of $H_2$ in the first, the second, or the third combined gas, whichever is used in the plasma treatment, may be between about 4 percent and about 5 percent. The hydrogen helps reduce the metal oxide on the surfaces of metal pads 112 back to metal. Furthermore, through the treatment, the number of OH groups at the surface of surface dielectric layer 110 is increased, which is beneficial for forming strong fusion bonds. The plasma treatment may also be performed using pure or substantially pure $H_2$, Ar, or $N_2$, as the process gas, which treats the surfaces of metal pads 112 and surface dielectric layer 110 through reduction and/or bombardment. The plasma used in the treatment may be low-power plasma, with the power for generating the plasma between about 10 Watts and about 2,000 Watts. In the surface treatment, partially due to the low power, the surface roughness of metal pads 112 and surface dielectric layer 110 are not changed compared to before the surface treatment, and may be maintained, for example, smaller than about 10 Å.

Figure 4:
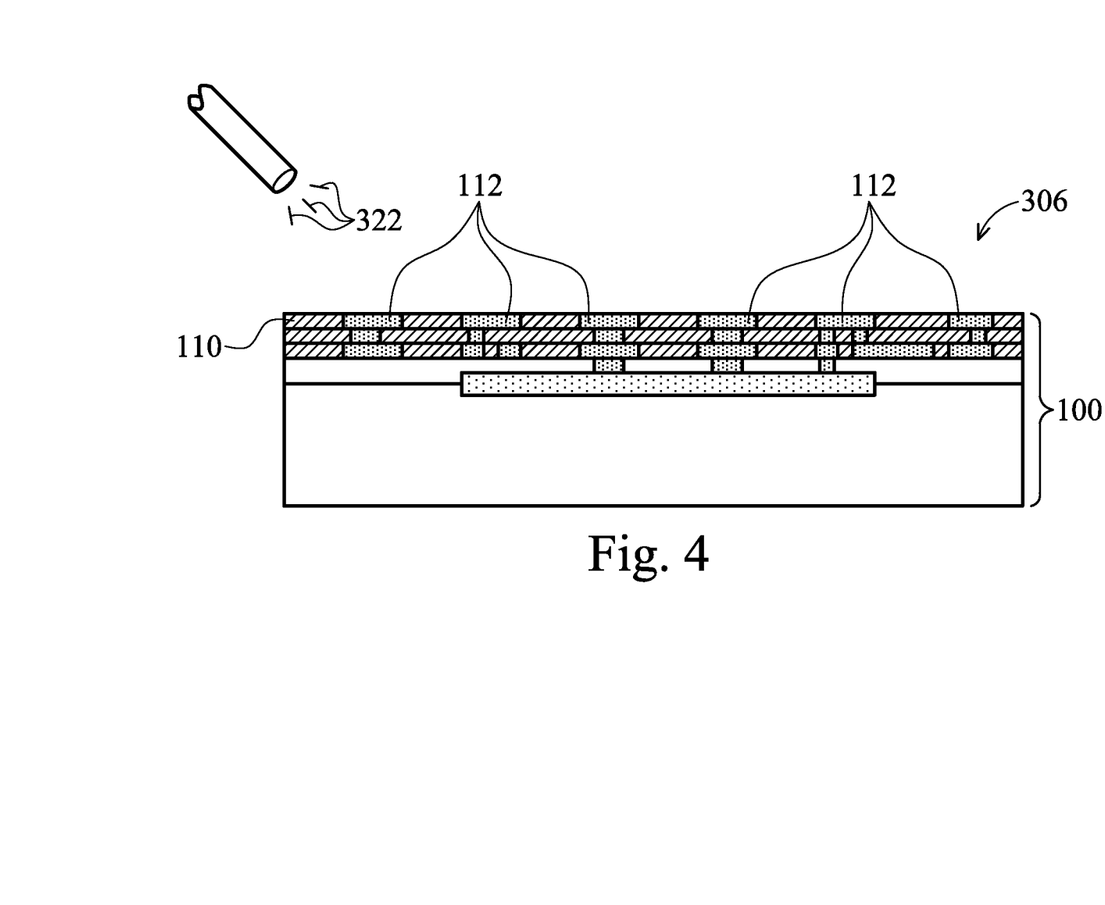

Using surface treatment station 304 in FIG. 3, package component 200 is also treated, which treatment is essentially the same as the treatment of package component 100. Next, referring to FIG. 4, package component 100 is transferred to surface cleaning station 306, and a surface clean is performed on package component 100. In some exemplary embodiments, the surface clean includes De-Ionized (DI) water rinsing, with DI water 322 being sprayed onto the surface of package component 100. In alternative embodiments, the surface cleaning is performed using Ammonium Hydroxide ($NH_4OH$). The surface cleaning is also performed on package component 200, which cleaning step is essentially the same as shown in FIG. 4.

Figure 5:
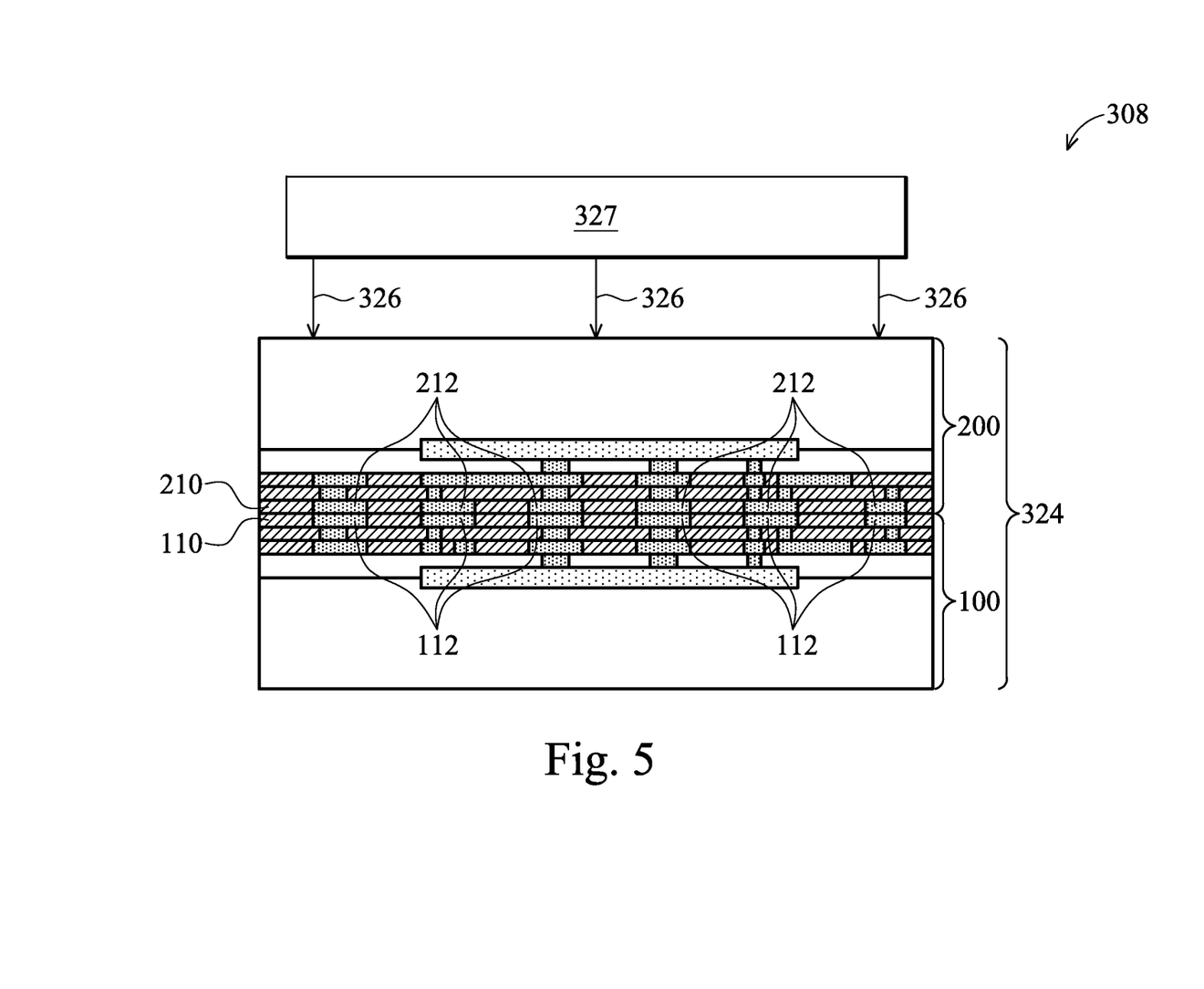

Next, as shown in FIG. 5, package components 100 and 200 are transferred into pre-bonding station 308 (also refer to FIG. 11). Package components 100 and 200 are aligned, with bond pads 112 of package component 100 aligned to bond pads 212 of package component 200. The alignment may be performed in pre-bonding station 308, although it may also be performed in a separate alignment station. After the alignment, package components 100 and 200 are pressed against each other. A pin (not shown) may be used to press on one point of package component 200 first, instead of pressing package component 200 through multiple points at the same time. Accordingly, any air between package components 100 and 200 will be squeezed out through the pressing of the pin.

Next, as also shown in FIG. 5, the pre-bonding is performed. During the pre-bonding, pressing force 326 is applied by presser 327 to press package components 100 and 200 against each other. Pressing force 326 may be lower than about 5 Newton, which may be applied to the centers of package components 100 and 200. The pre-bonding may be performed at the room temperature (for example, close to about 21° C.), although higher temperatures may be used. The bonding time may be shorter than about 1 minute, for example.

The pre-bonding is a hybrid bonding, in which metal pads 112 and 212 are bonded to each other through direct metal-to-metal bonding, and oxide layers 110 and 210 are bonded to each other through fusion bonding. Package components 100 and 200 in combination, which have been pre-bonded, are referred to as bonded pair 324 throughout the description.

Figure 6:
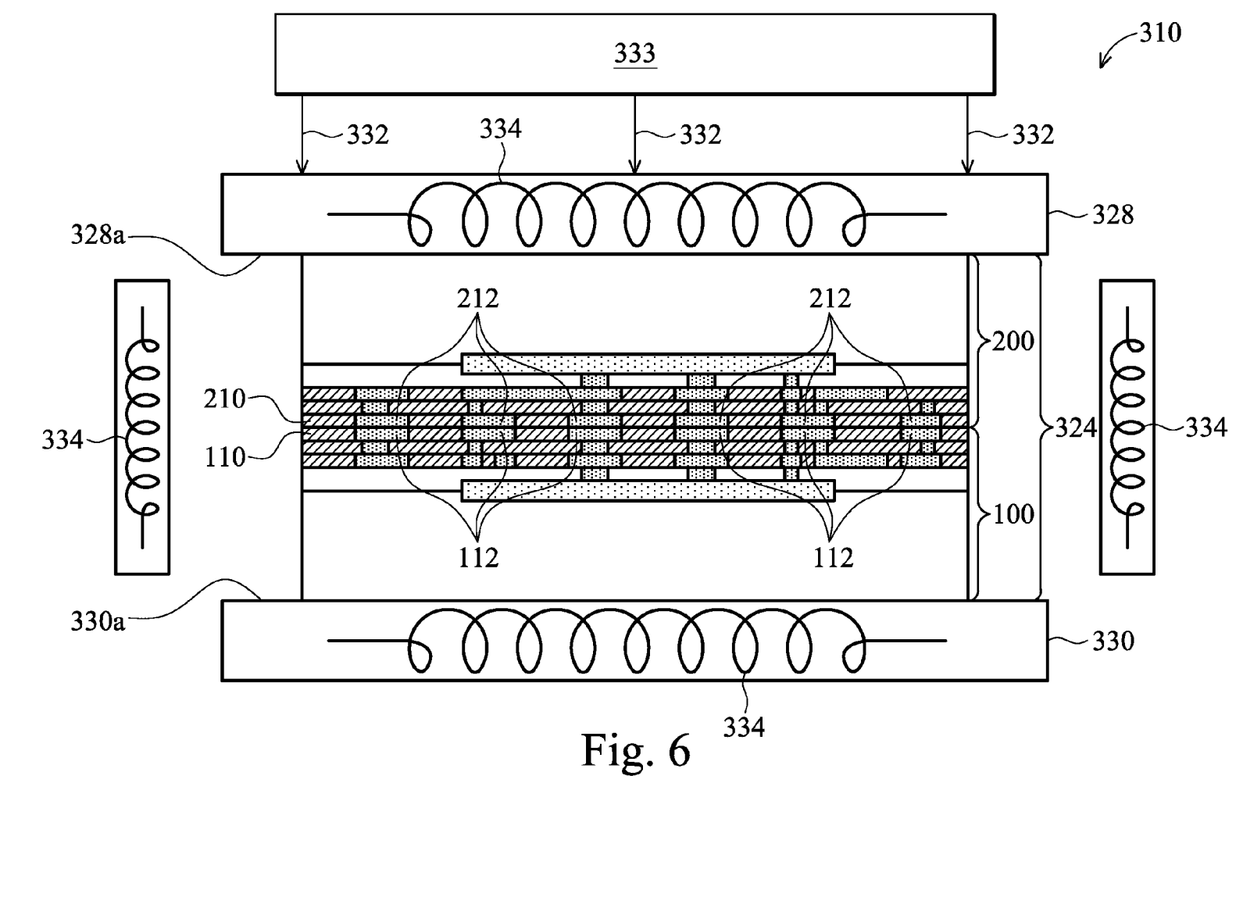

The bonding strength of bonded pair 324 may need to be improved due to the relatively low pressing force and low temperature used in the pre-bonding. The improvement in the bonding strength is achieved through a thermal compressive annealing, which is shown in FIG. 6 in accordance with some exemplary embodiments. FIG. 6 illustrates parts of thermal compressive annealing station 310 (also refer to FIG. 11). During the thermal compressive annealing, compressive force 332 is applied to press package components 100 and 200 against each other. Compressive force 332 may be applied by presser 333, which may apply force 332 through hydraulic power or air pressure. In some embodiments, the pressing force 332 is between 5 Kilonewton and about 350 Kilonewton, depending on the density and the areas of bond pads 112/212 of the package components 100/200.

During the thermal compressive annealing, the temperatures of package components 100 and 200 may be increased to higher than about 200° C., and may be between about 300° C. and about 450° C., in order to anneal the bonds between metal pads 112 and 212. The duration of the thermal compressive annealing may be between about 0.5 hours and about 4 hours. The thermal compressive annealing station 310 may be filled with hydrogen ($H_2$), nitrogen ($N_2$), or the like, which is filled to the pressure of one atmosphere or higher.

The annealing results in the inter-diffusion of metal pads 112 and 212, and hence the enhancement of the bonding between metal pads 112 and 212. Metal pads 112 and 212, however, have greater Coefficients of Thermal Expansion (CTEs) than surface dielectric layers 110 and 210. Accordingly, with the elevated temperature of the thermal compressive annealing, metal pads 112 and 212 expand more than surface dielectric layers 110 and 210, and tend to protrude out of the surfaces of the respective surface dielectric layers 110 and 210. As a result, surface dielectric layers 110 and 210 tend to delaminate from each other. The pressing force 332 applied during the thermal compressive annealing is used to prevent the delamination. Furthermore, with the pressing force 332, the strength of the fusion bonding between dielectric layers 110 and 210 are also enhanced. The pressing force 332 may be removed after the thermal compressive annealing is finished, and after package components 100 and 200 are cooled.

FIG. 6 illustrates a single-pair thermal compressive annealing step, in which a single bonded pair 324 is annealed at one time. Bonded pair 324 is placed under top plate 328, and over bottom plate 330. Bottom plate 330 and top plate 328 have sizes greater than the sizes of bonded pair 324 in order to hold bonded pair 324. Bottom plate 330 comprises a flat top surface 330a for supporting bonded pair 324. Top plate 328 may also comprise a flat top surface 328a for supplying uniform pressure to all portions of bonded pair 324. The pressing force 332 may be applied on top plate 328, which passes force 332 to bonded pair 324. In some embodiments, heater(s) 334 are embedded in top plate 328 and/or bottom plate 330 in order to heat bonded pair 324. In alternative embodiments, heaters 334 may be placed aside of bonded pair 324.

Figure 7:
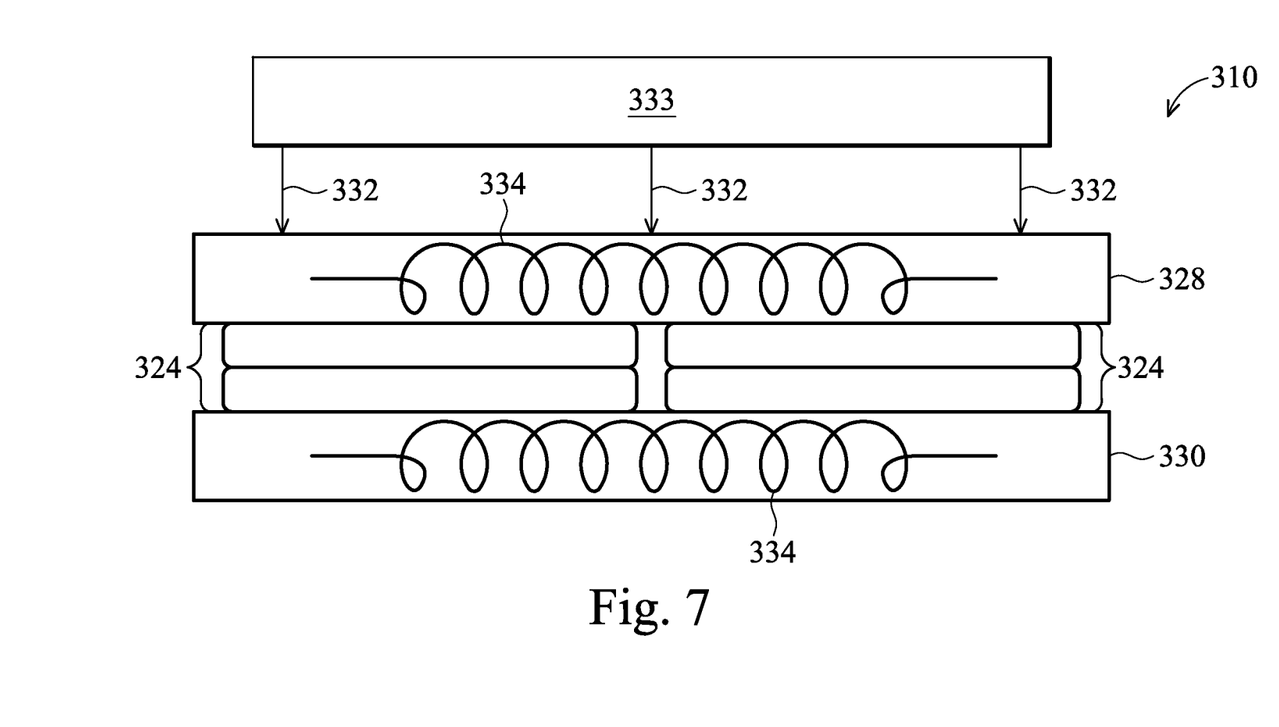
FIGS. 7 through 10 illustrate thermal compressive annealing in the bonding of package components in accordance with alternative embodiments.

FIG. 7 illustrates the embodiments for performing the thermal compressive annealing in accordance with alternative embodiments. These embodiments are similar to the embodiments in FIG. 6, except that a plurality of bonded pairs 324 is sandwiched between top plate 328 and bottom plate 330. The plurality of bonded pairs 324 is placed at the same level, so that bonded pairs 324 are annealed at the same time, and receives the same pressing force. The plurality of bonded pairs 324 may have an identical structure. Thermal compressive annealing station 310 is thus configured to perform the thermal compressive annealing on the plurality of bonded pairs 324 simultaneously. By annealing the plurality of bonded pairs 324 simultaneously, the throughput of the thermal compressive annealing is improved.

Figure 8:
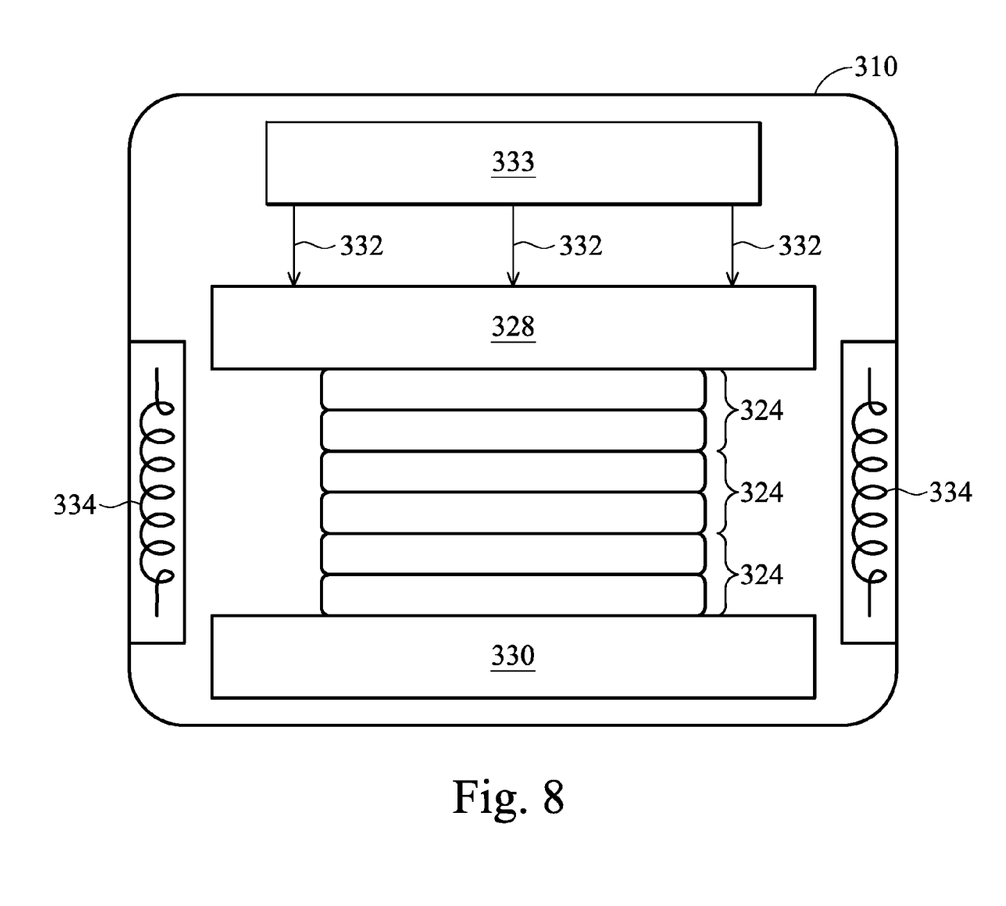

FIG. 8 illustrates a thermal compressive annealing in accordance with yet alternative embodiments, in which a plurality of stacked bonded pairs 324 is performed with thermal compressive annealing simultaneously. In these embodiments, the plurality of bonded pairs 324 is stacked, and is disposed between top plate 328 and bottom plate 330. The pressing force 332 is thus imparted to all bonded pairs 324, and from the upper ones of bonded pairs 324 to the lower ones of bonded pairs 324. In these embodiments, heaters 334 may be disposed aside of bonded pairs 324, although additional heaters (not shown) may be added into top plate 328 and bottom plate 330.

Figure 9:
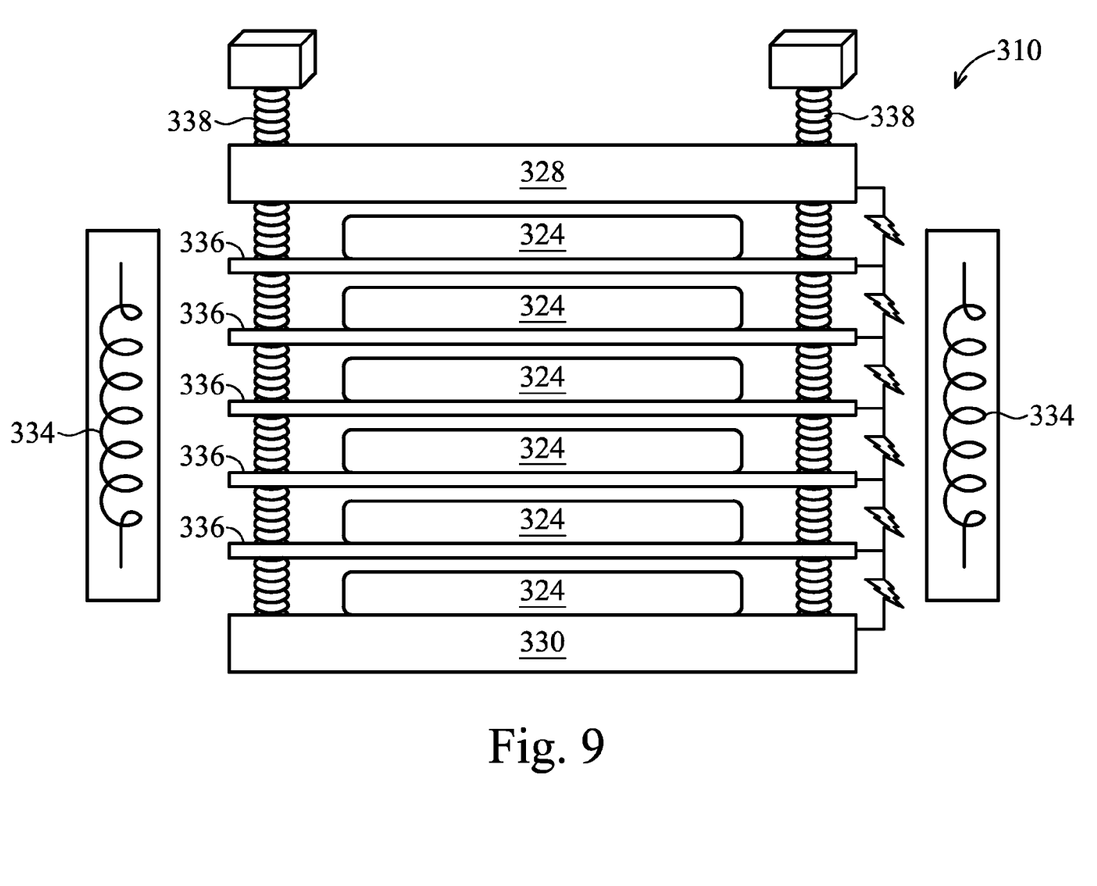
Figure 10:
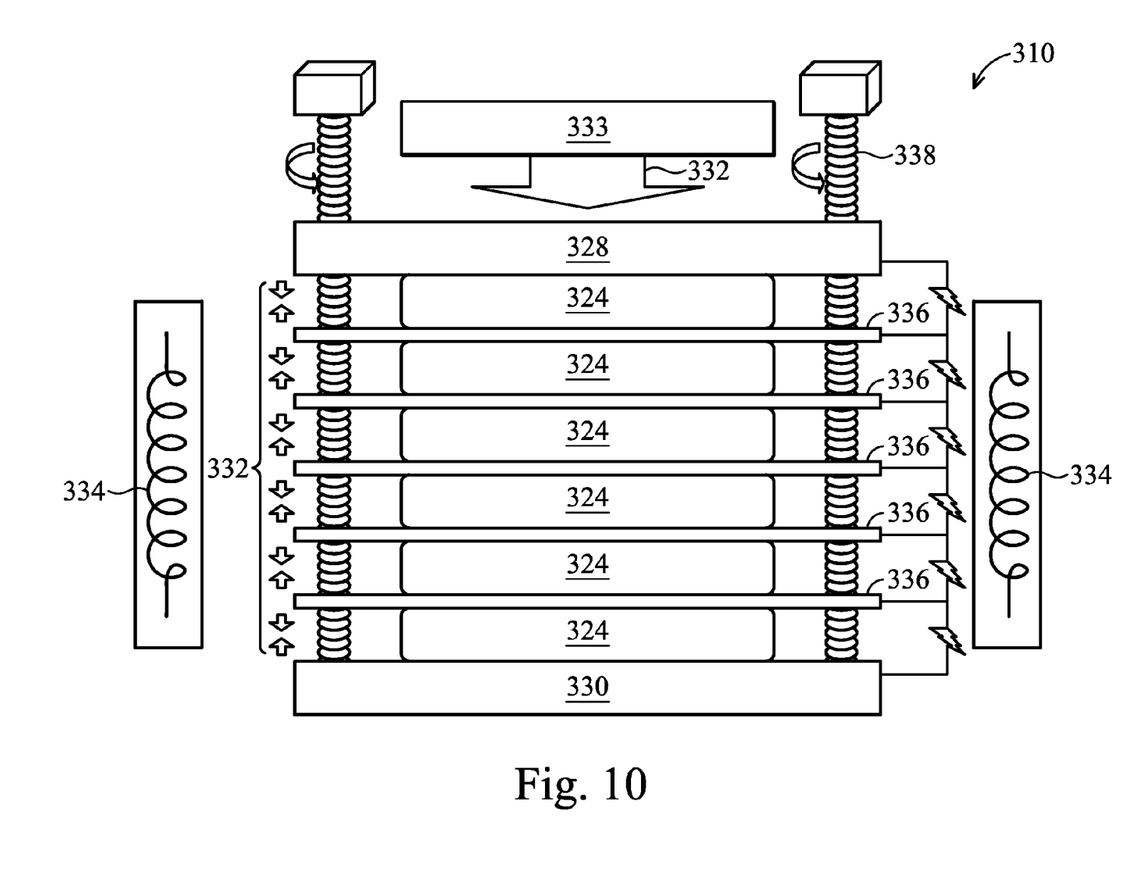

FIGS. 9 and 10 illustrate the thermal compressive annealing in accordance with yet alternative embodiments. These embodiments are similar to the embodiments in FIG. 8, except that guides 338 are installed, for example, fixed on bottom plate 330. Separators 336 are disposed, and are configured to be able to glide along guides 338. Bonded pairs 324 are disposed on separators 336. As shown in FIG. 9, initially, separators 336 have enough clearance from each other, so that one or a plurality of bonded pairs 324 can be placed over each of separators 336. Next, as shown in FIG. 10, pressing force 332 is applied to press down top plate 328. Separators 336 moves down along guides 338, and each of separators 336, when receiving the force from the overlying bonded pair 324, also imparts the pressing force to the underlying bonded pair 324. During the thermal compressive annealing, the pressing force 332 and the elevated temperature is maintained, for example, through heaters 334 disposed aside of bonded pairs 324.

In the embodiments of the present disclosure, by performing the thermal compressive annealing after the pre-bonding of package components, the bond strength of the direct metal-to-metal bonding is enhanced, and the likely delamination between the bonded dielectric layers is eliminated. The bonding strength of the fusion bonding is also improved.

In accordance with some embodiments, a method includes performing a hybrid bonding to bond a first package component to a second package component, so that a bonded pair is formed. In the bonded pair, first metal pads in the first package component are bonded to second metal pads in the second package component, and a first surface dielectric layer at a surface of the first package component is bonded to a second surface dielectric layer at a surface of the second package component. After the hybrid bonding, a thermal compressive annealing is performed on the bonded pair.

In accordance with other embodiments, a method includes aligning a first wafer to a second wafer, and bonding the first wafer to the second wafer to form a bonded pair. The bonded pair includes metal-to-metal bonds and fusion bonds. The metal-to-metal bonds include first metal pads in the first wafer bonded to second metal pads in the second wafer. The fusion bonds include a first surface dielectric layer at a surface of the first wafer bonded to a second surface dielectric layer at a surface of the second wafer. After the step of bonding, an annealing is performed on the bonded pair. During the annealing, the first wafer and the second wafer are pressed against each other by a pressing force.

In accordance with yet other embodiments, an apparatus for bonding a first package component to a second package component includes a pre-bonding station configured to bond the first package component to the second package component through a hybrid bonding to form a bonded pair. The apparatus further includes a thermal compressive bonding station, which includes a pressing tool configured to press the first package component against the second package component, and a heater configured to heat the first package component and the second package component.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
performing a hybrid bonding in a pre-bonding station to bond a first package component to a second package component to form a bonded pair, wherein first metal pads in the first package component are bonded to second metal pads in the second package component, and a first surface dielectric layer at a surface of the first package component is bonded to a second surface dielectric layer at a surface of the second package component;
wherein after the hybrid bonding, the first metal pads are bonded to the second metal pads through direct metal-to-metal bonding, and the first surface dielectric layer is bonded to the second surface dielectric layer through fusion bonding;
after the hybrid bonding, transferring the bonded pair from the pre-bonding station to a thermal compressive annealing station; and
in the thermal compressive annealing station, performing a thermal compressive annealing on the bonded pair.

2. The method of claim 1, wherein an oxide comprised in the first surface dielectric layer is bonded to the second surface dielectric layer.

3. The method of claim 1, wherein during the thermal compressive annealing, a plurality of bonded pairs identical to the bonded pair is placed between a bottom plate and a top plate, and is placed at a same level as the bonded pair, wherein the plurality of bonded pairs is physically disconnected from each other, and wherein during the thermal compressive annealing, a pressing force is applied to the top plate.

4. The method of claim 1, wherein during the thermal compressive annealing, a plurality of bonded pairs identical to the bonded pair is placed between a bottom plate and a top plate, and is stacked, and wherein during the thermal compressive annealing, a pressing force is applied to the top plate.

5. The method of claim 1, wherein during the thermal compressive annealing, a plurality of bonded pairs identical to the bonded pair is each placed over one of a plurality of separators, with the plurality of separators being guided by a guide, and wherein during the thermal compressive annealing, a pressing force is applied to press the plurality of bonded pairs.

6. The method of claim 1 further comprising, before the hybrid bonding, performing a plasma treatment or an acid treatment on one of the first package component and the second package component.

7. A method comprising:
aligning a first wafer to a second wafer;
bonding the first wafer to the second wafer to form a bonded pair in a pre-bonding station, wherein the bonded pair comprises:
metal-to-metal bonds comprising first metal pads in the first wafer bonded to second metal pads in the second wafer; and
fusion bonds comprising a first surface dielectric layer at a surface of the first wafer bonded to a second surface dielectric layer at a surface of the second wafer;
after the step of bonding, transferring the bonded pair from the pre-bonding station to a thermal compressive annealing station; and
in the thermal compressive annealing station, performing an annealing on the bonded pair, wherein during the annealing, the first wafer and the second wafer are pressed against each other by a pressing force.

8. The method of claim 7, wherein the annealing is performed at a temperature between 300° C. and 450° C.

9. The method of claim 7, wherein the pressing force is between 5 Kilonewton and 350 Kilonewton.

10. The method of claim 7, wherein the annealing is performed for a period of time between 0.5 hours and 4 hours.

11. The method of claim 7, wherein during the annealing, a plurality of bonded pairs identical to the bonded pair receives the pressing force simultaneously, and is annealed simultaneously, and the plurality of bonded pairs is not bonded to each other.

12. The method of claim 7, wherein during the annealing, a plurality of bonded pairs identical to the bonded pair is each placed over one of a plurality of separators, with the plurality of separators being guided by a guide, and wherein during the annealing, a pressing force is applied to the plurality of bonded pairs simultaneously.

13. The method of claim 7 further comprising, before the step of bonding, performing a plasma treatment on each of the first wafer and the second wafer.

14. A method comprising:
performing a hybrid bonding in a pre-bonding station to form a plurality of bonded pairs, wherein each of the plurality of bonded pairs comprises:
a first package component bonded to a second package component to form a bonded pair, wherein first metal pads in the first package component are bonded to second metal pads in the second package component, and the first metal pads and the second metal pads are non-solder metal pads;
a first surface dielectric layer at a surface of the first package component bonded to a second surface dielectric layer at a surface of the second package component; and
after the hybrid bonding, transferring the plurality of bonded pairs from the pre-bonding station to a thermal compressive annealing station; and
in the thermal compressive annealing station, performing a thermal compressive annealing on the plurality of bonded pairs, wherein during the thermal compressive annealing, the plurality of bonded pairs is placed between a bottom plate and a top plate, and is placed at a same level, and during the thermal compressive annealing, a pressing force is applied to the top plate.

15. The method of claim 14, wherein the first surface dielectric layer comprises a silicon-containing dielectric bonded to the second surface dielectric layer.

16. The method of claim 14, wherein a top surface of each of the plurality of bonded pairs is in contact with the top plate, and a bottom surface of each of the plurality of bonded pairs is in contact with the bottom plate, and each of the plurality of bonded pairs is a discrete pair physically separate from remaining ones of the plurality of bonded pairs.

17. The method of claim 14 further comprising, before the hybrid bonding, performing a plasma treatment or an acid treatment on the first package component.

18. The method of claim 11, wherein the plurality of bonded pairs is stacked into a same stack, and wherein in the annealing, a pressing force is applied to a top bonded pair in the stack.

19. The method of claim 11, wherein the plurality of bonded pairs is at a same level, and is placed between a top plate and a bottom plate.

20. The method of claim 1, wherein the first metal pads and the second metal pads are non-solder metal pads.

* * * * *